United States Patent [19]

Heyke et al.

[11] 4,328,512
[45] May 4, 1982

[54] TWO-ELEMENT SEMICONDUCTOR DIODE RECTIFIER ASSEMBLY STRUCTURE

[75] Inventors: Klaus Heyke; Günter Schmidt, both of Reutlingen; István Ragály, Schwieberdingen, all of Fed. Rep. of Germany

[73] Assignee: Robert Bosch GmbH, Stuttgart, Fed. Rep. of Germany

[21] Appl. No.: 114,835

[22] Filed: Jan. 24, 1980

Related U.S. Application Data

[63] Continuation of Ser. No. 903,908, May 8, 1978, abandoned.

[30] Foreign Application Priority Data

Jun. 16, 1977 [DE] Fed. Rep. of Germany ....... 2727178

[51] Int. Cl.³ ................. H01L 23/32; H01L 23/28; H01L 23/02
[52] U.S. Cl. .................................. 357/76; 357/72; 357/75; 357/79; 357/81
[58] Field of Search ................. 357/72, 74, 75, 76, 357/79, 81

[56] References Cited

U.S. PATENT DOCUMENTS

| | | | |
|---|---|---|---|
| 2,516,344 | 7/1950 | Ross et al. | 357/72 |
| 2,897,420 | 7/1959 | Butt | 357/75 |
| 3,179,855 | 4/1965 | Brombaugh | 357/79 |
| 3,183,407 | 5/1965 | Yasuda et al. | 357/75 |
| 3,486,084 | 12/1969 | Zido | 357/72 |
| 3,713,007 | 1/1973 | Waiter | 357/79 |
| 3,754,169 | 8/1973 | Lyon et al. | 357/76 |

FOREIGN PATENT DOCUMENTS

| | | | |
|---|---|---|---|
| 1973009 | 11/1967 | Fed. Rep. of Germany | 357/76 |
| 1031890 | 6/1966 | United Kingdom | 357/72 |
| 1251837 | 11/1971 | United Kingdom | 357/72 |

OTHER PUBLICATIONS

RCA Technical Notes; Isolated Power Diode Assembly by Hausman; TN #841, pp. 1 and 2.

*Primary Examiner*—Andrew J. James
*Attorney, Agent, or Firm*—Frishauf, Holtz, Goodman & Woodward

[57] ABSTRACT

To improve the stability and robustness of a rectifier and to protect it against atmospheric influences, two plate-like, series-connected semiconductor diodes are soldered to a common tap electrode between them. An external lead wire is soldered to each of the remaining sides of the diodes. The entire soldered structure is embedded in a single mass of resin or plastic, the ends of the electrodes being configured to serve as anchoring elements in the plastic mass.

5 Claims, 6 Drawing Figures

TWO-ELEMENT SEMICONDUCTOR DIODE RECTIFIER ASSEMBLY STRUCTURE

This is a continuation of application Ser. No. 903,908, filed May 8, 1978, now abandoned.

FIELD OF THE INVENTION

The invention relates to rectifiers, especially rectifiers having two series-connected semi-conductor diodes and a tap at their junction. The rectifiers are intended especially for use in rectifier bridge circuits associated with AC generators.

BACKGROUND OF THE INVENTION AND PRIOR ART

In known rectifiers of the type described above, the two diodes are plates of semi-conductive material between which is placed a conductor serving as tap. Two further conductors are attached to the remaining sides of the diodes by soldering. A rectifier of this kind is described, for example, in the German Gebrauchsmuster No. 1 973 009. In that device, the tap is a relatively massive housing which has special ledges on which the semi-conductors are to be fastened at one of their plane sides by soldering. Lead wires are soldered to the remaining sides of the semi-conductors. Each of the semi-conductor plates and the adjacent part of the lead wire and of the ledge is surrounded by a resin coating, applied by casting or pressing. It is a disadvantage of this known construction that the resin coatings must be applied separately to each of the diode structures. Shaping the tap as a relatively massive housing element is a further disadvantage.

Another recitifier with series-connected semi-conductor diodes is described in German Auslegeschrift No. 1 098 104. The device described there is placed in a housing and has protruding connector pins.

SUMMARY OF THE INVENTION

The present invention provides a rectifier composed of two series-connected solid state diodes and a tap connected to their junction. The rectifier has lead wires connected to the remaining sides of the diodes by soldering. It is a principal object of the invention to provide a rectifier which is impervious to the effects of the atmosphere and is mechanically robust. These and other objects are attained, according to the invention, by embedding the entire rectifier, including the two diodes and all three leads, in a common, integral mass of resin or the like. The invention further provides that the electrical leads include means for anchoring them and the attached structure within the surrounding resin. In one embodiment of the invention, one of the leads is constructed as a relatively massive metal base having an annular protrusion which engages the resinuous material while the other leads have enlarged end portions which act similarly.

The invention will now be described by way of a number of preferred examples with reference to the drawing.

DESCRIPTION OF THE DRAWING

In the first exemplary embodiment of the invention, FIG. 1, shows, in axial section, a first semi-conductor diode 1 and a second semi-conductor diode 2, both of plate-like shape and stacked one above the other. A central lead, or tap 3 is placed between them and soldered to the respective plane sides of the diodes. The remaining plane sides of the diodes 1 and 2 are soldered, respectively, to conducting terminals 4 and 5.

Figure 5:
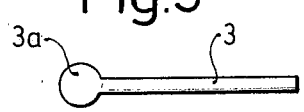
FIG. 5 is a top view of the tap lead connected to the junction of the two diodes in the rectifier according to the invention.

The conductor 3 is substantially a wire which is enlarged at the end making contact with the diodes to form a plane and approximately circular plate 3a, shown best in FIG. 5, which is large enough to extend everywhere beyond the diodes 1 and 2. The terminal 4 has a lead portion and further abuts the plane end of the diode 1 with an enlarged head portion 4a which also extends beyond the diode 1 on all sides. The head portion 4a is soldered to the diode 1. The terminal 5 is constructed as a relatively massive base 5a with a raised center portion 5b which has approximately the same diameter as the head portion 4a of the conductor 4 and which also extends beyond the adjacent diode 2. Each of the diodes 1 and 2 has at least one internal p-n junction which extends substantially parallel to the plane external surfaces of the diodes and which meets the diode surface at the edges. Lacquer is applied to the region of these edges after the structure is soldered together. Subsequently, the structure is made, by casting or pressing, with a continuous mass 7 of resin or the like, extending from the surface 6 of the conductor 5 beyond the top of the head portion 4a of the conductor 4 which is thus anchored securely, especially against axial stress. An obliquely extending annular lip 5c of the conductor 5 is also engaged by the resin and anchors the conductor therein. The slant of the lip may be, for example, approximately 45° respect to the surface 6. A similar anchoring is provided to the tap lead 3 by its plate-like enlargement 3a. The indented or crenelated outline of the stack formed by the diodes 1 and 2 and electrodes 3 and 4 anchors the elements in position within the resinous mass.

Figure 1:
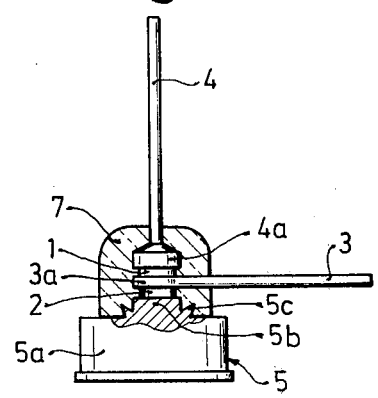
FIG. 1 is an axial section through a first embodiment of the rectifier according to the invention.
Figure 2:
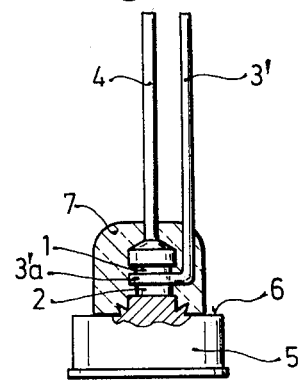
FIG. 2 is an axial section through a second embodiment of the rectifier according to the invention.

The second embodiment FIG. 2, is similar to that shown in FIG. 1 except that the lead 3 is bent upwardly and extends parallel to the lead 4 within the resin mass 7.

Figure 3:
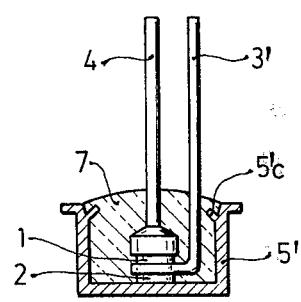
FIG. 3 is an axial section through a third embodiment of the rectifier according to the invention.

The bent structure of the lead 3 is retained in the third embodiment shown in FIG. 3. In this example, the massive base 5 of the previous embodiments is replaced by a cup-like member 5' which substantially contains the resinous mass 7. An inwardly extending lip 5'c serves to anchor the cup 5' in the resin; the angle which the lip makes with the axis of the cup 5' may be, for example, 45° approximately.

Figure 4:
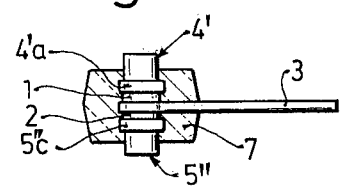
FIG. 4 is an axial section through a fourth embodiment of the rectifier according to the invention.

A fourth embodiment of the invention is illustrated in FIG. 4. The two conductors 4' and 5' are identical metallic bolts while the tap lead 3 is substantially similar to that of FIGS. 1 and 5. The two bolts 4' and 5" are anchored in the resinous mass 7 by means of heads 4'a and 5"c, respectively, whose diameter is greater than that of the body of the bolts and greater than the diameter of the diodes 1 and 2. The various elements shown are soldered together and lacquered in a manner similar to that used for the examples of FIGS. 1, 2 and 3 after which the resinous mass 7 is applied to the soldered structure by casting or pressing so as to surround it completely.

Figure 6:
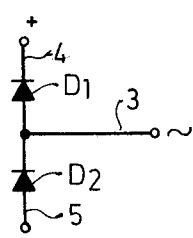
FIG. 6 is a circuit diagram illustrating the electrical connections in the recitifier according to the invention.

FIG. 6 is a circuit diagram of the diodes 1 and 2, now labeled D1 and D2, respectively. As shown, the polarity of the two diodes is the same in the rectifier structure of the present invention.

We claim:

1. An encapsulated full-wave rectifier assembly structure comprising:
   first and second circular plate or disk-shaped semiconductor diodes (1,2) of similar diameter connected in electrical series and geometrically stacked above each other in superposed alignment;
   a first electrode (3) having a laterally extending wire portion and a a flat circular disk-like plate portion (3a) of larger diameter than the diameter of said diodes, and forming a first projecting portion, sandwiched between, aligned with, and providing an anchoring and soldering surface soldered to said first and second diodes;
   a second electrode (4) soldered to the side of said first diode (1) remote from said first electrode (3) having a circular head portion (4a) of larger diameter than the diameter of the diode (1) to which it is connected, and forming a second projecting portion;
   a third electrode (5) soldered to the side of said second diode (2) remote from said first electrode (3) and formed with a circumferentially projecting portion;
   said diodes and electrodes forming an aligned stack in which the different diameters of the diodes and the electrodes define an indented or crenelated outer surface;
   a single, continuous integral cast or pressed resinous mass (7) surrounding said first, second and third electrodes with the diodes therebetween, the indented or crenelated surface defined by the difference in diameter of the projecting portions of said electrodes and said diodes, and the laterally extending wire portion of the first electrode (3) forming anchor means to anchor the stack in said resinous mass,
   at least one of said second electrode (4) and said third electrode (5) being formed as a solid metal base (5a) having a raised central platform (5b) defining a shoulder surface (6) and the respective projecting portion of the diameter larger than said diodes includes an obliquely extending annular lip projecting from the shoulder surface and forming said anchor means, said resinous mass surrounding said structure up to said shoulder surface (6);
   wherein at least one of said second electrode (4) and said third electrode (5) has a head-shaped enlargement where it is soldered to its respective diode, said head-shaped enlargement (4a, 5"c) serving as said anchor means;
   and wherein said wire portion extends laterally outside of said mass.

2. An encapsulated full-wave rectifier assembly structure comprising:
   first and second circular plate or disk-shaped semiconductor diodes (1,2) of similar diameter connected in electrical series and geometrically stacked above each other in superposed alignment;
   a first electrode (3) having a laterally extending wire portion and a a flat circular disk-like plate portion (3a) of larger diameter than the diameter of said diodes, and forming a first projecting portion, sandwiched between, aligned with, and providing an anchoring and soldering surface soldered to said first and second diodes;
   a second electrode (4) soldered to the side of said first diode (1) remote from said first electrode (3) having a circular head portion (4a) of larger diameter than the diameter of the diode (1) to which it is connected, and forming a second projecting portion;
   a third electrode (5) soldered to the side of said second diode (2) remote from said first electrode (3) and formed with a circumferentially projecting portion;
   said diodes and electrodes forming an aligned stack in which the different diameters of the diodes and the electrodes define an indented or crenelated outer surface;
   a single, continuous integral cast or pressed resinous mass (7) surrounding said first, second and third electrodes with the diodes therebetween, the indented or crenelated surface defined by the difference in diameter of the projecting portions of said electrodes and said diodes, and the laterally extending wire portion of the first electrode (3) forming anchor means to anchor the stack in said resinous mass,
   at least one of said second electrode (4) and said third electrode (5) being formed as a solid metal base (5a) having a raised central platform (5b) defining a shoulder surface (6) and the respective projecting portion of the diameter larger than said diodes includes an obliquely extending annular lip projecting from the shoulder surface and forming said anchor means, said resinous mass surrounding said structure up to said shoulder surface (6);
   wherein at least one of said second electrode (4) and said third electrode (5) has a head-shaped enlargement where it is soldered to its respective diode, said head-shaped enlargement (4a, 5"c) serving as said anchor means;
   wherein the wire portion of the first electrode (3') is bent within the extent of said resinous mass.

3. An encapsulated full-wave rectifier assembly structure comprising:
   first and second circular plate or disk-shaped semiconductor diodes (1,2) of similar diameter connected in electrical series and geometrically stacked above each other in superposed alignment;
   a first electrode (3) having a laterally extending wire portion and a a flat circular disk-like plate portion (3a) of larger diameter than the diameter of said diodes, and forming a first projecting portion, sandwiched between, aligned with, and providing an anchoring and soldering surface soldered to said first and second diodes;
   a second electrode (4) soldered to the side of said first diode (1) remote from said first electrode (3) having a circular head portion (4a) of larger diameter than the diameter of the diode (1) to which it is connected, and forming a second projecting portion;

a third electrode (5) soldered to the side of said second diode (2) remote from said first electrode (3) and formed with a circumferentially projecting portion;

said diodes and electrodes forming an aligned stack in which the different diameters of the diodes and the electrodes define an indented or crenelated outer surface;

a single, continuous integral cast or pressed resinous mass (7) surrounding said first, second and third electrodes with the diodes therebetween, the indented or crenelated surface defined by the difference in diameter of the projecting portions of said electrodes and said diodes, and the laterally extending wire portion of the first electrode (3) forming anchor means to anchor the stack in said resinous mass, wherein said second electrode (4) has a head-shaped enlargement where it is soldered to said first diode (1), said head-shaped enlargement (4a) serving as said anchor means;

wherein said third electrode (5) is shaped in form of a hollow cup (5') which encloses said resinous mass (7) at the bottom and on all sides, and wherein the projecting portion comprises an inwardly projecting annular lip (5'c) forming said anchor means;

and wherein the wire portion of said first electrode (3') is bent within the extent of said resinous mass and within the outline of said hollow cup (5').

4. An encapsulated full-wave rectifier assembly structure comprising:

first and second circular plate or disk-shaped semiconductor diodes (1,2) of similar diameter connected in electrical series and geometrically stacked above each other in superposed alignment;

a first electrode (3) having a laterally extending wire portion and a a flat circular disk-like plate portion (3a) of larger diameter than the diameter of said diodes, and forming a first projecting portion, sandwiched between, aligned with, and providing an anchoring and soldering surface soldered to said first and second diodes;

a second electrode (4) formed as a bolt having an enlarged head, (4'a) said head soldered to the side of said first diode (1) remote from said first electrode (3), and being of larger diameter than the diameter of the diode (1) to which it is connected, and forming a second projecting portion;

a third electrode (5) formed as a bolt having an enlarged head (5"c), said head being soldered to the side of the diode (2) remote from said first electrode (3) and of larger diameter than the diameter of the diode (2) to which it is connected, and forming a third projecting portion;

said diodes and electrodes forming an aligned stack in which the different diameters of the diodes and the electrodes define an indented or crenelated outer surface; and a single, continuous integral cast or pressed resinous mass (7) surrounding said first, second and third electrodes with the diodes therebetween, the indented or crenelated surface defined by the difference in diameter of the projecting portions of said electrodes and said diodes forming anchor means to anchor the stack in said resinous mass.

5. A rectifier according to claim 1 or 2 or 3, wherein said electrode comprises a wire-like lead portion on the head portion (4a) of the second electrode.

* * * * *